(12) United States Patent
Aidan et al.

(10) Patent No.: US 12,339,741 B2
(45) Date of Patent: Jun. 24, 2025

(54) BIT EFFICIENT MEMORY ERROR CORRECTING CODING AND DECODING SCHEME

(71) Applicant: Google LLC, Mountain View, CA (US)

(72) Inventors: Fabrice Aidan, Ramat HaSharon (IL); Evgeni Krimer, Haifa (IL)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/132,686

(22) Filed: Apr. 10, 2023

(65) Prior Publication Data
US 2024/0289212 A1    Aug. 29, 2024

Related U.S. Application Data

(60) Provisional application No. 63/448,488, filed on Feb. 27, 2023.

(51) Int. Cl.
*G06F 11/10* (2006.01)
*H03M 13/00* (2006.01)
*H03M 13/15* (2006.01)

(52) U.S. Cl.
CPC ..... *G06F 11/1044* (2013.01); *H03M 13/1515* (2013.01); *H03M 13/613* (2013.01)

(58) Field of Classification Search
CPC .......... G06F 11/1044; H03M 13/1515; H03M 13/613
USPC ........................................ 714/763, 767, 768
See application file for complete search history.

(56) References Cited

U.S. PATENT DOCUMENTS

| | | | |
|---|---|---|---|
| 9,189,323 B2 * | 11/2015 | Hida | H03M 13/2906 |
| 11,625,296 B2 * | 4/2023 | Niu | G06F 11/1048 |
| | | | 714/764 |
| 11,675,662 B2 * | 6/2023 | Schaefer | G06F 11/1072 |
| | | | 714/755 |
| 11,726,665 B1 * | 8/2023 | Sabbag | G06F 3/0652 |
| | | | 711/154 |
| 2014/0164871 A1 | 6/2014 | Franceschini et al. | |
| 2015/0143185 A1 * | 5/2015 | Motwani | G11C 29/44 |
| | | | 714/718 |
| 2015/0200685 A1 * | 7/2015 | Kawano | G06F 11/10 |
| | | | 714/758 |
| 2017/0004035 A1 * | 1/2017 | Suh | G11C 29/52 |
| 2018/0095821 A1 * | 4/2018 | Vogt | G11C 11/4093 |

(Continued)

FOREIGN PATENT DOCUMENTS

| | | |
|---|---|---|
| EP | 3198440 B1 | 8/2021 |
| WO | 2022139849 A1 | 6/2022 |

OTHER PUBLICATIONS

International Search Report and Written Opinion for International Application No. PCT/US2023/028356 dated Oct. 31, 2023. 11 pages.

(Continued)

*Primary Examiner* — Albert Decady
*Assistant Examiner* — Osman M Alshack
(74) *Attorney, Agent, or Firm* — Lerner David LLP

(57) ABSTRACT

Aspects of the disclosed technology include techniques and mechanisms for an efficient error correction coding scheme that can detect and correct data errors that may occur in a memory. In general, the scheme comprises segmenting the data that would be transferred as part of a data request into different parts and applying error correction codes to the separate parts.

20 Claims, 8 Drawing Sheets

(56) References Cited

U.S. PATENT DOCUMENTS

| | | |
|---|---|---|
| 2018/0254079 A1* | 9/2018 | Cox .................. G11C 29/52 |
| 2019/0188074 A1 | 6/2019 | Coteus et al. |
| 2019/0227869 A1* | 7/2019 | Bradshaw ......... H03M 13/2909 |
| 2019/0296774 A1* | 9/2019 | Uchikawa ........... G06F 11/1012 |
| 2020/0133769 A1* | 4/2020 | Bains .................. G06F 11/1048 |
| 2020/0249840 A1* | 8/2020 | Chen ................... G06F 3/064 |
| 2021/0141692 A1* | 5/2021 | Agarwal .............. H03M 13/19 |
| 2022/0157398 A1* | 5/2022 | Cunningham ..... H03M 13/1111 |

OTHER PUBLICATIONS

Kim et al., "Bamboo ECC: Strong, Safe, and Flexible Codes for Reliable Computer Memory," 2015 IEEE 21st International Symposium on High Performance Computer Architecture (HPCA), Burlingame, CA, USA, 2015. 12 pages.

Kim and Erez, "Balancing Reliability, Cost, and Performance Tradeoffs with FreeFault," 2015 IEEE 21st International Symposium on High Performance Computer Architecture (HPCA), Burlingame, CA, USA, 2015. 13 pages.

* cited by examiner

100

300

| | At Risk Map 9 | | | |
|---|---|---|---|---|
| | DQ0 | DQ1 | DQ2 | DQ3 |
| BL0 | 0 | 8 | 16 | 24 |
| BL1 | 1 | 9 | 17 | 25 |
| BL2 | 2 | 10 | 18 | 26 |
| BL3 | 3 | 11 | 19 | 27 |
| BL4 | 4 | 12 | 20 | 28 |
| BL5 | 5 | 13 | 21 | 29 |
| BL6 | 6 | 14 | 22 | 30 |
| BL7 | 7 | 15 | 23 | 31 |
| BL8 | 64 | 72 | 80 | 88 |
| BL9 | 65 | 73 | 81 | 89 |
| BL10 | 66 | 74 | 82 | 90 |
| BL11 | 67 | 75 | 83 | 91 |
| BL12 | 68 | 76 | 84 | 92 |
| BL13 | 69 | 77 | 85 | 93 |
| BL14 | 70 | 78 | 86 | 94 |
| BL15 | 71 | 79 | 87 | 95 |

| | At Risk Map 10 | | | |
|---|---|---|---|---|
| | DQ0 | DQ1 | DQ2 | DQ3 |
| BL0 | 0 | 8 | 16 | 24 |
| BL1 | 1 | 9 | 17 | 25 |
| BL2 | 2 | 10 | 18 | 26 |
| BL3 | 3 | 11 | 19 | 27 |
| BL4 | 4 | 12 | 20 | 28 |
| BL5 | 5 | 13 | 21 | 29 |
| BL6 | 6 | 14 | 22 | 30 |
| BL7 | 7 | 15 | 23 | 31 |
| BL8 | 64 | 72 | 80 | 88 |
| BL9 | 65 | 73 | 81 | 89 |
| BL10 | 66 | 74 | 82 | 90 |
| BL11 | 67 | 75 | 83 | 91 |
| BL12 | 68 | 76 | 84 | 92 |
| BL13 | 69 | 77 | 85 | 93 |
| BL14 | 70 | 78 | 86 | 94 |
| BL15 | 71 | 79 | 87 | 95 |

| | At Risk Map 13 | | | |
|---|---|---|---|---|
| | DQ0 | DQ1 | DQ2 | DQ3 |
| BL0 | 0 | 8 | 16 | 24 |
| BL1 | 1 | 9 | 17 | 25 |
| BL2 | 2 | 10 | 18 | 26 |
| BL3 | 3 | 11 | 19 | 27 |
| BL4 | 4 | 12 | 20 | 28 |
| BL5 | 5 | 13 | 21 | 29 |
| BL6 | 6 | 14 | 22 | 30 |
| BL7 | 7 | 15 | 23 | 31 |
| BL8 | 64 | 72 | 80 | 88 |
| BL9 | 65 | 73 | 81 | 89 |
| BL10 | 66 | 74 | 82 | 90 |
| BL11 | 67 | 75 | 83 | 91 |
| BL12 | 68 | 76 | 84 | 92 |
| BL13 | 69 | 77 | 85 | 93 |
| BL14 | 70 | 78 | 86 | 94 |
| BL15 | 71 | 79 | 87 | 95 |

| | At Risk Map 14 | | | |
|---|---|---|---|---|
| | DQ0 | DQ1 | DQ2 | DQ3 |
| BL0 | 0 | 8 | 16 | 24 |
| BL1 | 1 | 9 | 17 | 25 |
| BL2 | 2 | 10 | 18 | 26 |
| BL3 | 3 | 11 | 19 | 27 |
| BL4 | 4 | 12 | 20 | 28 |
| BL5 | 5 | 13 | 21 | 29 |
| BL6 | 6 | 14 | 22 | 30 |
| BL7 | 7 | 15 | 23 | 31 |
| BL8 | 64 | 72 | 80 | 88 |
| BL9 | 65 | 73 | 81 | 89 |
| BL10 | 66 | 74 | 82 | 90 |
| BL11 | 67 | 75 | 83 | 91 |
| BL12 | 68 | 76 | 84 | 92 |
| BL13 | 69 | 77 | 85 | 93 |
| BL14 | 70 | 78 | 86 | 94 |
| BL15 | 71 | 79 | 87 | 95 |

| | At Risk Map 15 | | | |
|---|---|---|---|---|
| | DQ0 | DQ1 | DQ2 | DQ3 |
| BL0 | 0 | 8 | 16 | 24 |
| BL1 | 1 | 9 | 17 | 25 |
| BL2 | 2 | 10 | 18 | 26 |
| BL3 | 3 | 11 | 19 | 27 |
| BL4 | 4 | 12 | 20 | 28 |
| BL5 | 5 | 13 | 21 | 29 |
| BL6 | 6 | 14 | 22 | 30 |
| BL7 | 7 | 15 | 23 | 31 |
| BL8 | 64 | 72 | 80 | 88 |
| BL9 | 65 | 73 | 81 | 89 |
| BL10 | 66 | 74 | 82 | 90 |
| BL11 | 67 | 75 | 83 | 91 |
| BL12 | 68 | 76 | 84 | 92 |
| BL13 | 69 | 77 | 85 | 93 |
| BL14 | 70 | 78 | 86 | 94 |
| BL15 | 71 | 79 | 87 | 95 |

| | At Risk Map 16 | | | |
|---|---|---|---|---|
| | DQ0 | DQ1 | DQ2 | DQ3 |
| BL0 | 0 | 8 | 16 | 24 |
| BL1 | 1 | 9 | 17 | 25 |
| BL2 | 2 | 10 | 18 | 26 |
| BL3 | 3 | 11 | 19 | 27 |
| BL4 | 4 | 12 | 20 | 28 |
| BL5 | 5 | 13 | 21 | 29 |
| BL6 | 6 | 14 | 22 | 30 |
| BL7 | 7 | 15 | 23 | 31 |
| BL8 | 64 | 72 | 80 | 88 |
| BL9 | 65 | 73 | 81 | 89 |
| BL10 | 66 | 74 | 82 | 90 |
| BL11 | 67 | 75 | 83 | 91 |
| BL12 | 68 | 76 | 84 | 92 |
| BL13 | 69 | 77 | 85 | 93 |
| BL14 | 70 | 78 | 86 | 94 |
| BL15 | 71 | 79 | 87 | 95 |

400
Figure 4

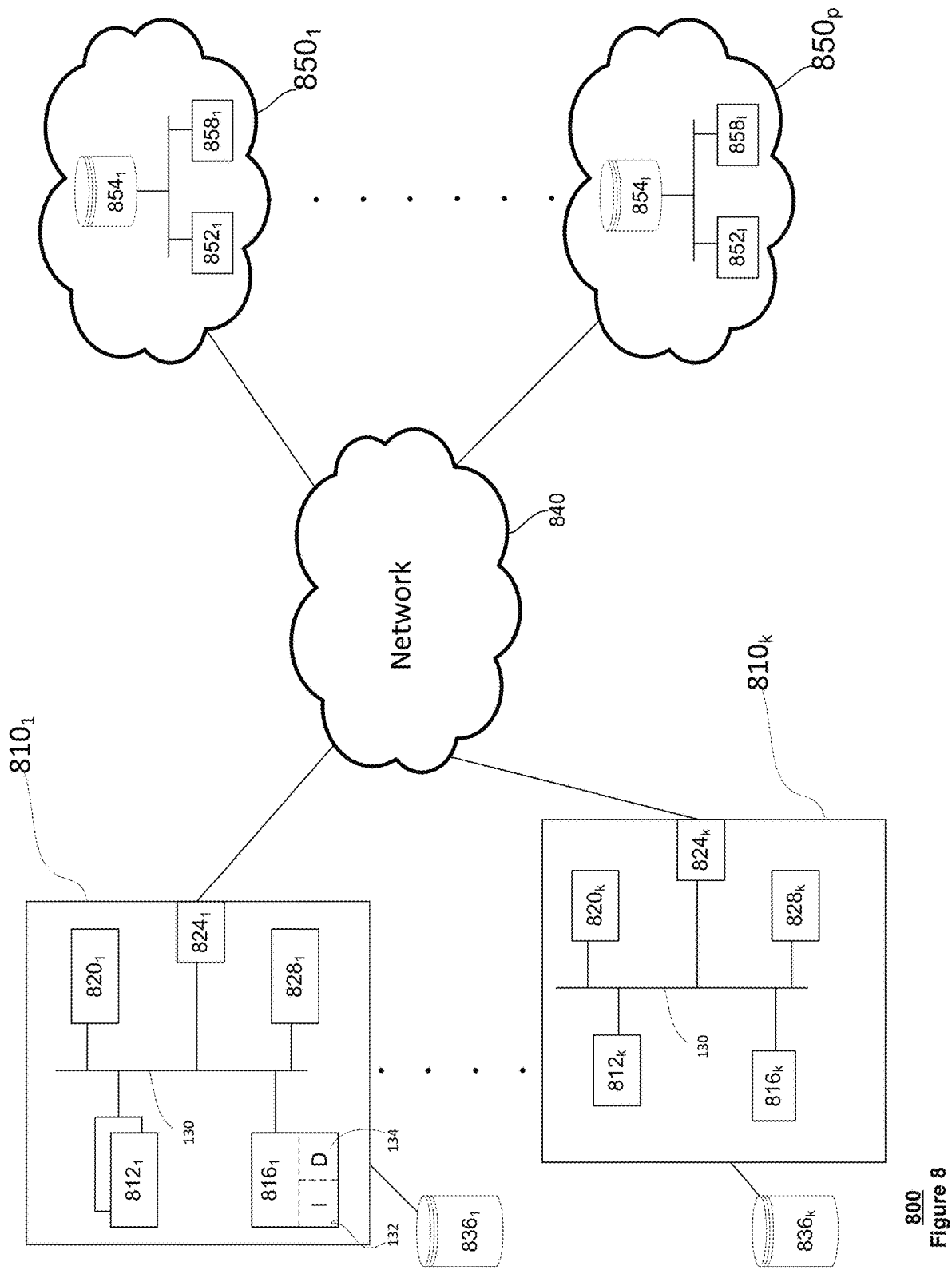

BIT EFFICIENT MEMORY ERROR CORRECTING CODING AND DECODING SCHEME

CROSS-REFERENCE TO RELATED APPLICATIONS

The present application claims the benefit of the filing date of U.S. Provisional Patent Application No. 63/448,488, filed Feb. 27, 2023, the disclosure of which is hereby incorporated herein by reference.

BACKGROUND

Cloud computing, more generally client-server computing, has become a mainstay for many business enterprises as it provides what some consider to be essential computing services offered via the cloud (e.g., a network of servers, storage, databases, software, and other equipment and services made available by cloud platform providers such as Google) that result in operational and cost advantages. Cloud services (e.g., SaaS, PaaS, IaaS) are typically provided via data centers located at different geographic locations. Each data center usually houses various computing resources and other network equipment that receive, process, and/or store voluminous amounts of data arriving at the datacenter and transmit processed data to other data centers or end user devices (e.g., servers, personal computers, cellular devices, or, more generally, client devices).

Dynamic Random Access Memory (DRAM) plays an important, if not critical, role in the data processing that takes place in a data center. As data processing needs have increased, so has the size of DRAMs. DRAM components are vulnerable to faults. DRAM faults have a deleterious effect on the performance of services offered via data centers. For example, DRAM faults or errors can lead to hardware and/or software systems crashes. These faults include a single bit in the DRAM flipping to its opposite state (e.g., '1' to '0' or vice versa) or multiple bits flipping from their correct states.

Error correction codes (ECCs) are used to detect and protect against memory errors in, for example, DRAMs. ECCs are added to the DRAM by a memory controller. The number of bits used to form an ECC impacts the capacity of the code to detect and correct multiple errors, as well as the size of DRAM since additional storage capacity is required of the DRAM to store the ECC. For example, if the number of bits impacted by errors is beyond the limit of the ECC's capability, the error is typically uncorrectable, resulting in system shutdown or crash.

SUMMARY

Aspects of the disclosed technology may comprise a method or process for encoding or decoding data stored in a memory, a memory controller having a certain logic or a memory system for encoding or decoding data stored in a memory.

For example, the disclosed technology may comprise a method for encoding data associated with a request access for one or more DRAM devices. The method may comprise segmenting a number of beats defined for a burst access to the one or more DRAMs in at least a first set of beats and a second set of beats; defining a first error correction code (ECC) for a first set of the data associated with the first set of beats; and defining a second ECC for a second set of the data associated with the second set of beats, wherein the first ECC comprises a first set of symbols, each symbol of the first set being associated with the first set of beats, and wherein the second ECC comprises a second set of symbols, each symbol of the second set of symbols being associated with the second set of beats.

In accordance with this aspect of the disclosed technology, the first set of beats and the second set of beats are equal the number of beats defined for the burst access. Further, the one or more DRAMs comprise DDR5 DRAMs and the number of beats defined for the burst access comprises 16 beats. In addition, the first set of beats and second set of beats each comprise 8 beats. Further, the one or more DRAMs each include 4 data pins.

In accordance with this aspect of the disclosed technology, the one or more DRAMs comprise 10 DRAMs and the first error correction code comprises a Reed Solomon with code 8 ECCs for 32 data symbols and 8 bits/symbol such as RS(40, 32, 8). The one or more DRAMs may also comprise 9 DRAMs in a 9×5 configuration or 5 DRAMs in a 5×8 configuration. In accordance with this aspect of the disclosed technology, the method may further comprise defining a second 4 byte symbol associated with the second error ECC, the second 4 byte symbol comprising metadata associated with a memory tag extension or another ECC scheme.

In another aspect, the disclosed technology may comprise a memory system. The memory system may comprise one or more DRAMs; and a memory controller communicatively coupled to the one or more DRAMs, the memory controller having logic that implements the following function in response to a request access to the one or more DRAMs: segment a number of beats defined for a burst access to the one or more DRAMs in at least a first set of beats and a second set of beats; define a first error correction code (ECC) for a first set of the data associated with the first set of beats; define a second ECC for a second set of the data associated with the second set of beats; wherein the first ECC comprises a first set of symbols, each symbol of the first set being associated with the first set of beats, and wherein the second ECC comprises a second set of symbols, each symbol of the second set of symbols being associated with the second set of beats. In accordance with this aspect of the disclosed technology, the first set of beats and the second set of beats equal the number of beats defined for the burst access. Further, the one or more DRAMs comprises DDR5 DRAMs and the number of beats defined for the burst access comprises 16 beats. Further, the first set of beats and the second set of beats each comprise 8 beats. Further, the one or more DRAMs each include 4 data pins.

In accordance with this aspect of the disclosed technology, the one or more DRAMs comprise 10 DRAMs and the first error correction code comprises a Reed Solomon with code 8 ECCs for 32 data symbols and 8 bits/symbol such as RS(40, 32, 8). The one or more DRAMs may also comprise 9 DRAMs in a 9×5 configuration or 5 DRAMs in a 5×8 configuration. In accordance with this aspect of the disclosed technology, the method may further comprise defining a second 4 byte symbol associated with the second error ECC, the second 4 byte symbol comprising metadata associated with a memory tag extension or another ECC scheme.

Further in accordance with this aspect of the disclosed technology, the logic comprises hardware logic comprising an encoder and a decoder. Further, the encoder encodes the first set of data using the first ECC in a first cycle of a 64 byte transaction and the encoder encodes the second set of data using the second ECC in a second cycle of the 64 byte transaction. In addition, the decoder decodes the first set of data using the first ECC in a first cycle of the 64 byte transaction and the decoder decodes the second set of data using the second ECC in a second cycle of the 64 byte transaction.

BRIEF DESCRIPTION OF THE DRAWINGS

FIG. 4 illustrates a bounded fault map example associated with DDR5 DRAM technology.

FIG. 8 depicts an example of a system in accordance with an aspect of the disclosed technology.

DETAILED DESCRIPTION

Aspects of the disclosed technology include techniques and mechanisms for an efficient error correction coding scheme that can detect and correct data errors that may occur in a memory. In general, the scheme comprises segmenting the data that would be transferred as part of a data request into different parts and applying error correction codes to the separate parts. The scheme is efficient in that fewer bits can be used to code the different data parts and robust in that it has the same detection and correction capability as existing ECCs, e.g., can correct up to four data output pin (DQ) errors. The scheme also frees up ECC bits for other functions (e.g., store metadata or form a secondary error detection and/or correction code scheme) without impacting the capability of the ECC to detect and correct errors.

Figure 1:
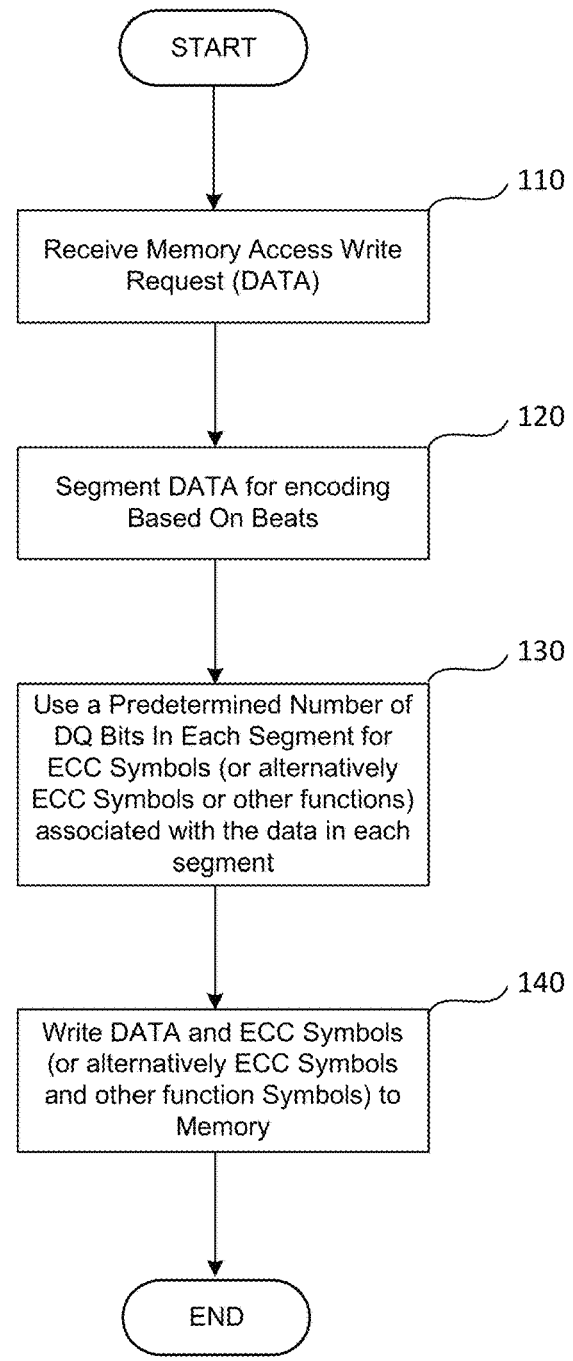
FIG. 1 illustrates a method or process flow in accordance with an aspect of the disclosed technology.

FIG. 1 shows a method or process flow 100 in accordance with an aspect of the disclosed technology. In this example, the method or process 100 depicts encoding data to be written to a memory device as part of a memory access request. The basic transfer unit of a memory access request is a beat, which comprises a single bus access. There may be multiple beats in a single block or multiple block transfer (e.g., a 64 byte transfer). As shown, the process 100 begins with receipt of a request to write to data to a memory, block 110. The write request will typically include a block of data (DATA) that is destined to be written via a set of DQs into memory. A DQ is an output pin of a DRAM device which drives data upon request. The write request, for example, may occur as a burst transfer, in which a consecutive number of data transfers are made via a set of DQs to the memory until the operation is complete (e.g., 64 bytes are transferred). Such an operation is more generally referred to as burst access and includes both write and read requests.

Figure 2:
FIG. 2 illustrates an example of the disclosed technology in the context of a memory transaction.

Upon receiving the memory access request to write data to memory, the data is segmented for encoding based on a number of beats, block 120. For example, let's assume the ECC scheme is being applied in an environment having DDR5 DRAM devices—though the scheme may be employed in environments that use other DDR standards. A burst access to such a DRAM device is assumed to comprise 16 beats and data is transferred in 64 byte data blocks. A typical DDR5 server configuration is the 10×4 configuration, i.e., 10 DRAM devices each having 4 DQs. Upon request, 4 DQs will drive a four bit data bus 16 times (1 bit per DQ for each of 16 beats) resulting in 64 bits or 8 bytes for each DRAM device. For 10 devices, a burst access results in 640 bits or 80 bytes of data. The convention is to use 64 bytes (8 DRAMs) to write data and 16 bytes (2 DRAMs) for ECCs. Segmenting in accordance with the disclosed technology comprises, for example, the error coding scheme shown in FIG. 2 for a 10×4 configuration. Specifically, as shown in FIG. 2, a first ECC codeword is applied to a first burst segment or part comprising UI0-UI7 (bracket 208) and a second ECC codeword is applied to a second burst segment or part UI8-UI15 (bracket 214). As such, the conventional burst access involving 16 beats is segmented into two bursts each comprising 8 beats.

The error coding scheme is then applied within each segment, as in block 130 of FIG. 1. Specifically, as shown in FIG. 2, in the first burst segment 208, the DQs associated with DRAMS 2 through 9 (bracket 224) are used for the data which the burst access request applies (e.g., being written into memory or read from memory). The DQs associated with DRAMs 0 and 1 (bracket 230) are used for encoding the data bits associated with DRAMs 2 through 9 in the first burst. In particular, bytes A0-A31 comprise data symbols, while bytes A32-A39 comprise ECC symbols. A similar scheme is employed for the second burst segment or part 214. Specifically, DRAMs 2 through 9 are used for data (i.e., bytes B0-B31), while DRAMs 0 and 1 are used for encoding and/or other purposes (i.e., bytes B32-39). For example, bytes B36-B39 may be saved and used for other purposes. In each burst segment or part, 64 bits or 8 bytes (8 beats/device×4 bits/beat×2 devices) are available to encode 256 bits or 32 bytes of data (8 beats/device×4 bits/beat×8 devices). In effect, the same number of bytes (16 bytes) are available to encode the same amount of data (64 bytes) as in the conventional case (in which each burst comprises 16 beats).

The error coding scheme may comprise a Reed Solomon (RS) error capability having 8 bits/symbol, 32 data symbols, and 8 ECC symbols (i.e., nECC)—commonly referred to as RS(40, 32, 8). Such a scheme allows for the capability to (i) detect and correct up to nECC/2 erroneous symbols—assuming the location(s) of the erroneous signals are unknown or (ii) detect and correct up to nECC erroneous symbols—assuming the location(s) of the erroneous symbols are previously known (sometimes referred to as "erasure code" capability). This scheme is often used with DDR5 DRAM devices.

In the example discussed above in relation to FIG. 2, the first burst segment or part may use 8 bytes for an 8 symbol ECC defined by a RS(40, 32, 8) code in which each 8 bit symbol is defined so as to match the 8 beats of a single DQ (resulting in one symbol per DQ). For the second burst segment or part, 4 bytes are used for a 4 symbol ECC as part of a RS(40, 32, 8), where each symbol is defined so as to match the 8 beats of a single DQ (resulting in one symbol per DQ). In FIG. 2, these symbols are associated with bytes B32-B35. As discussed below, only 4 bytes of ECC code may be used to decode errors that may occur in the second segment or part of the data. As such, an additional 4 bytes (B36-B39) may be used for other purposes, e.g., store metadata as part of Memory Tagging Extension (MTE) or encode another error detection and/or correction code.

Once the data is encoded as described in accordance with block 130 of FIG. 1, the DATA and ECC symbols are written to memory, as in block 140 of FIG. 1. The process then ends for this access request.

Figure 3:
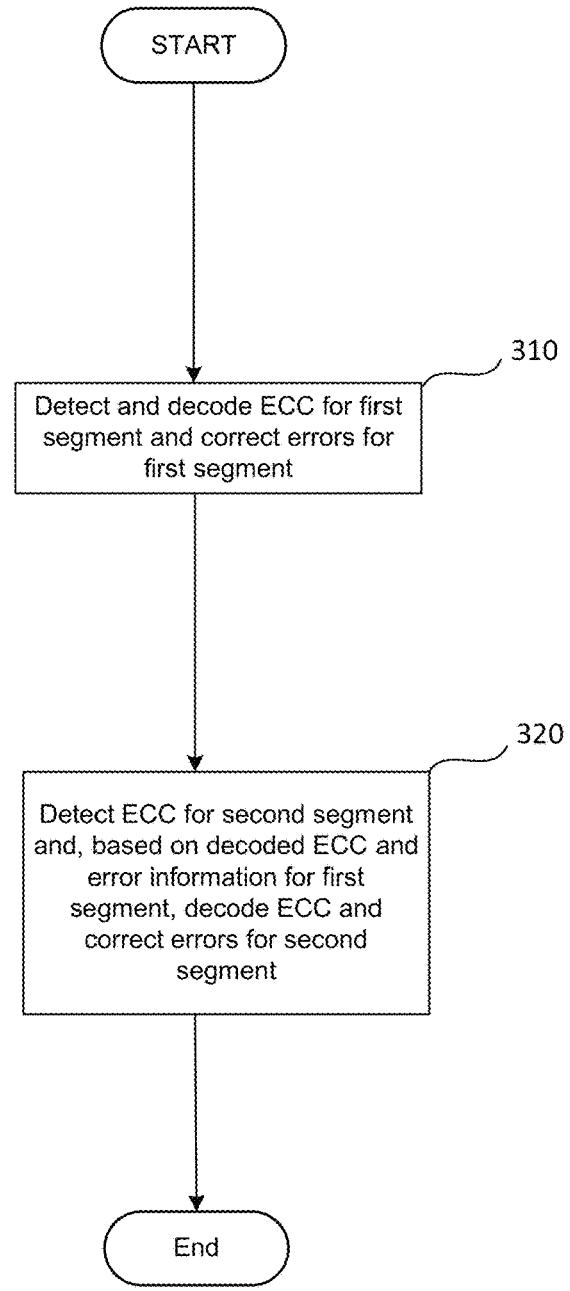
FIG. 3 illustrates a method or process flow in accordance with an aspect of the disclosed technology.

FIG. 3 depicts the steps of a method or process 300 for decoding data as part of a read memory access. The process 300 assumes the data was coded in line with the scheme disclosed in FIG. 2 in storing the data to memory. As such, a two part ECC code is associated with a first segment or part of the data, e.g., 8 ECC symbols that can correct up to 4 erroneous data symbols, assuming the location(s) of the erroneous symbols are unknown. As shown, at block 310, the process starts with the detection and decoding of the first segment of data, block 310. Using the 8 ECC symbols for the first segment and assuming the fault is bounded, its location may be limited to certain DQs.

At block 320, the ECC code for the second segment is decoded and, along with information learned from decoding the first segment, data errors associated with the second segment may be corrected. For example, assume that an RS(40, 32, 8) code was used to encode the 32 bytes of the first segment and an RS(40, 32, 8) code was used to encode the 32 bytes of the second segment.

In addition, a bounded fault map 400 for the DDR5 DRAMs is assumed as shown in FIG. 4, which limits possible faults or errors to specific fault patterns. As shown in FIG. 4, the faults may be generally divided into two categories: 1) faults which partially or fully impact 2 DQs; and 2) faults which fully impact up to 4 DQs (note that the probability of a fault that partially impacts 4 DQs is negligible and not shown).

Returning to block 310 in FIG. 3, let's assume that 2 errored data symbols are detected in the first segment or part. This means that the fault is restricted to up to 2 partial/full DQ maps in FIG. 4 (e.g., maps 10, 13, 14, 15, and 16). This information can be passed to the decoder for the second segment and used in decoding the second segment. In this example, the fault map location information means that in the second segment or part, there is a maximum of 2 symbol errors. The ECC associated with the second segment or part may then use the 4 ECC symbols to detect and correct up to 2 erroneous data symbols, without having to know their location(s).

As another example, let's assume that errored data symbols are detected in the first segment or part of the data associated with the read access burst request. This means that the fault is a full 4 DQ error (map 9 in FIG. 4). This means that in decoding the second segment or part, 4 data symbol errors are located in the same 4 DQs as for the first segment or part. This location information can be fed to the second segment or part decoder and it can use the "erasure code" capability of the Reed Solomon encoding scheme to correct the error. Specifically, since the location of the 4 errored data symbols is known, the decoding mechanism associated with the second segment may use the 4 ECC symbols to the correct the 4 erroneous data symbols.

Therefore, in accordance with the disclosed technology, the technique and/or mechanism provides the same detection and error correction capability as existing schemes and can correct up to 4 DQs errors, while using fewer bits. Specifically, in accordance with the disclosed technology, the ECC size is reduced by 4 bytes to 12 bytes as compared to the 16 bytes required by comparable conventional ECC schemes.

Figure 5:
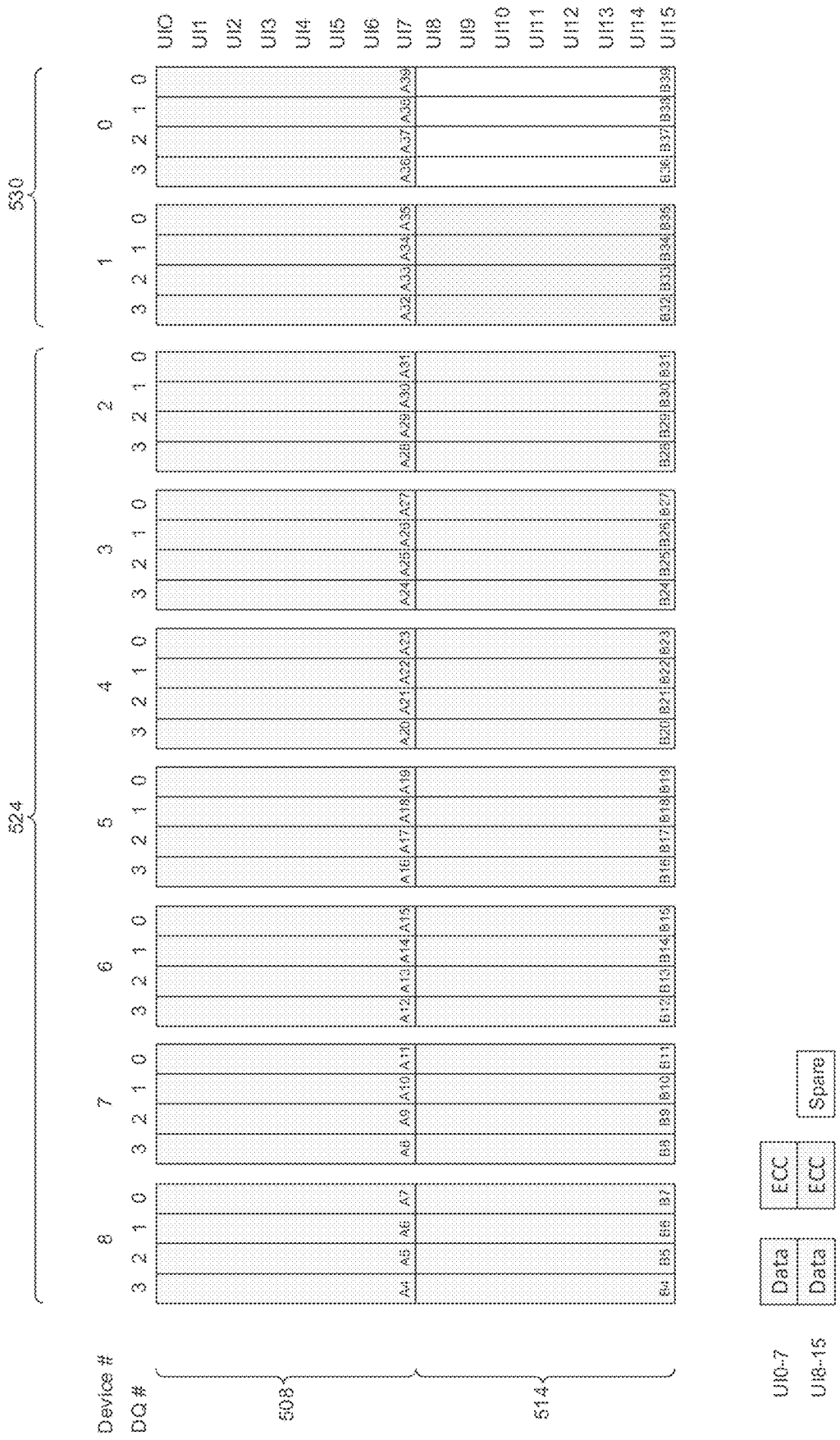
FIG. 5 illustrates an example of the disclosed technology in the context of a memory transaction request.

Turning now to FIG. 5, there is shown an example of the ECC scheme in a 9×4 configuration in accordance with an aspect of the disclosed technology. It is assumed that a burst access to this DRAM device comprises 16 beats and data is transferred in 64 byte data blocks. Upon request, 4 DQs will drive a four bit data bus 16 times (1 bit per DQ for each of 16 beats) resulting in 64 bits or 8 bytes for each DRAM device. For 9 devices, a burst access results in 576 bits or 72 bytes of data. 64 bytes (8 DRAMS) are used to write data and 8 bytes (1 DRAM) are used for ECCs. A first ECC is applied to a first burst segment or part comprising UI0-UI7 (bracket 508) and a second EEC is applied to a second burst segment or part UI8-UI15 (bracket 514). The conventional burst access involving 16 beats is thus segmented into two bursts each comprising 8 beats. In the first burst segment, the DQs associated with DRAMS 1 through 8 (bracket 524) are used for the data which the burst access request applies (e.g., being written into memory or read from memory). The DQs associated with DRAM 1 (bracket 530) are used for encoding the data bits associated with DRAMs 1 through 8 in the first burst. Specifically, in this example, in the first segment bytes A4-A35 comprise data symbols, while bytes A36-A39 comprise ECC symbols. For the second segment, bytes B4-B35 comprise data symbols, while bytes B36-B37 comprise ECC symbols and bytes B38-B39 comprise spare bytes that may be used for other purposes. As discussed above in relation to FIGS. 2 through 4, using an RS(40,32,8) ECC scheme and a bounded fault map, the error correction capability in this configuration is robust. Specifically, the first decoder information (UI0-7) includes more ECCs and the second decoder (UI8-15) can use information from the first decoder to correct the same amount of errors using the erasure code(s).

Figure 6:
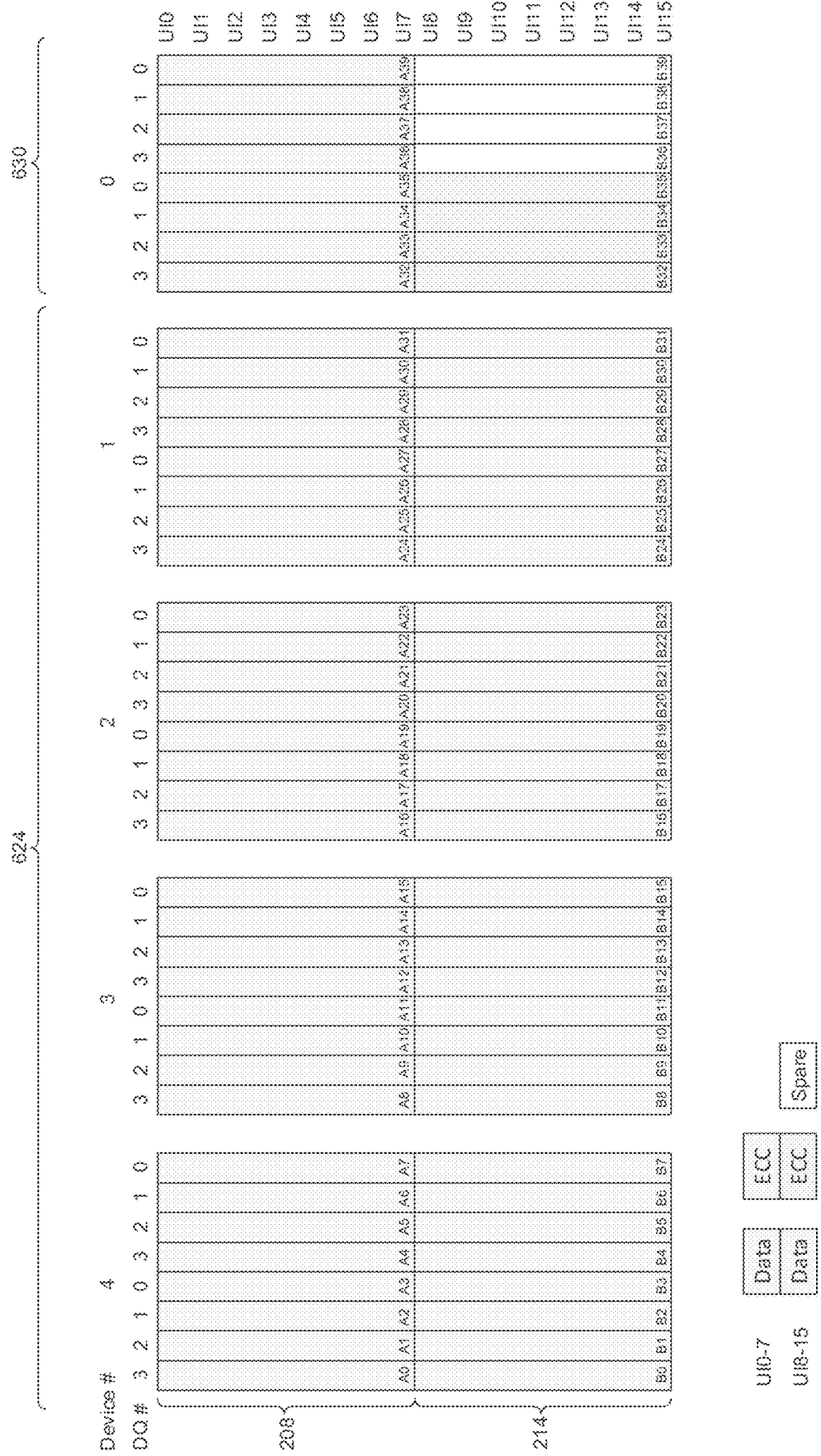
FIG. 6 illustrates an example of the disclosed technology in the context of a memory transaction.

Turning now to FIG. 6, there is shown an example of the ECC scheme in a 8×5 configuration in accordance with an aspect of the disclosed technology. As shown, the ECC coding scheme is segmented according to a first segment of a burst, e.g., UI0 through UI7 (see bracket 608), and a second segment of the burst, e.g., UI8 through UI15 (see bracket 614). In the first segment, bytes A0-A31 are used for data symbols, while bytes A32 through A39 are used for ECC symbols. In the second segment, bytes B32-B35 may be used for ECC symbols and bytes B36-B39 may be used for other functionality. Error coding and processing is done in a manner similar to that discussed above in relation to FIGS. 1, 2, and 3.

Figure 7:
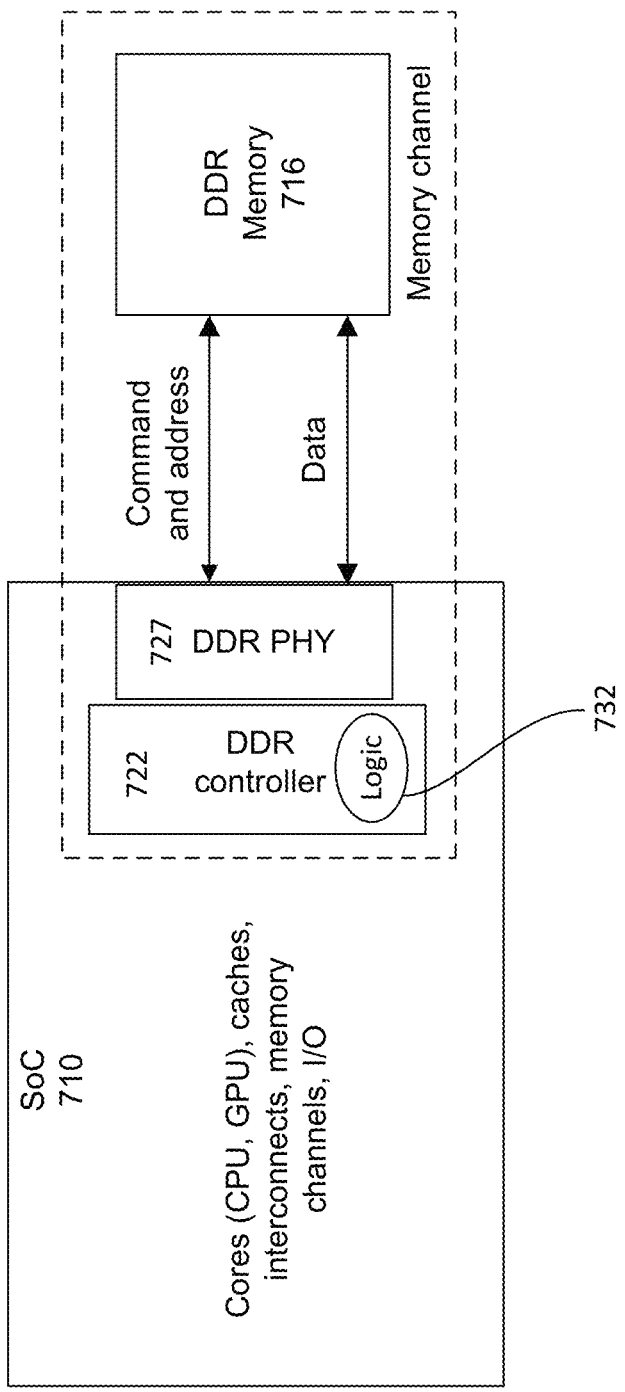
FIG. 7 depicts an example of a system in accordance with an aspect of the disclosed technology.

Turning now to FIG. 7, there is depicted an example system 700 in which the disclosed technology may be implemented. In this example, the system 700 includes a system on a chip (SoC) 710 communicatively coupled to a DDR memory 716. DDR memory 716 is shown as one block, but should be understood to also include multiple DRAM devices, e.g., one or more DIMMs. The SoC 710 includes a DDR controller 722 and physical interface 727, via which control (e.g., command and address) information and data may be transferred between the SoC 710 and DDR memory 716.

The DDR controller 722 includes logic 732 that implements the method or process discussed above in relation to FIGS. 1 through 6. Specifically, the SoC 710, as part of processing information (e.g., using processing elements forming its one or more cores), may need data to be stored to or retrieved from DDR memory 716. Logic 732, in the form of one or more instructions may be configured to implement the process flows of either FIG. 1 or FIG. 3 to encode data being written to DDR memory 716 or decode data being read from DDR memory 716 as discussed in relation to FIGS. 2, 4, 5 and 6. In an example implementation, both the encoder and decoder can be implemented in hardware logic (e.g., an ASIC) within DDR controller logic 732. In the implementation, the same encoder/decoder can be used twice per 64 byte transaction, once for UI0-UI7, then, in the next cycle, for UI8-UI15.

The system of FIG. 7 may be used in one or more larger systems, such as a server, host, smartphone, personal computer, or, more generally, any electronic device that makes use of a DRAM. As indicated above, DRAM plays an important role in cloud computing systems. In addition, as the size of the DRAMs continues to increase in such systems, the need for efficient ECC schemes in accordance with the disclosed technology is expected to increase. As such, the disclosed technology may be implemented in servers or host machines such as those shown in cloud computing system 800 of FIG. 8.

FIG. 8 is an example system 800 in accordance with aspects of the disclosure. System 800 includes one or more computing devices 810, which may comprise computing devices $810_1$ through $810_k$, storage 836, a network 840 and one or more cloud computing systems 850, which may comprise cloud computing systems $850_1$ through $850_p$. Computing devices 810 may comprise computing devices located at customer location that makes use of cloud computing services such as Infrastructure as a Service (IaaS), Platform as a Service (PaaS), and/or Software as a Service (SaaS). For example, if a computing device 810 is located at a business enterprise, computing device 810 may use cloud systems 850 as a service that provides software applications, e.g., accounting, word processing, inventory tracking, etc., applications, to computing devices 810 used in operating enterprise systems. In addition, computing device 810 may access cloud computing systems 850 as part of its operations that employ machine learning, or more generally artificial intelligence technology, to train applications that support its business enterprise. For example, computing device 810 may comprise a customer computer or server in a bank or credit card issuer that accumulates data relating to credit card use by its card holders and supplies the data to a cloud platform provider, who then processes that data to detect use patterns that may be used to update a fraud detection model or system, which may then notify the card holder of suspicious or unusual activity with respect to the card holder's credit. Other customers may include social media platform providers, government agencies, or any other business that uses machine learning as part of its operations.

As shown in FIG. 8, each of computing devices 810 may include one or more processors 812, memory 816 storing data and instructions, display 820, communication interface 824, and input system 828. The processors 812 and memories 816 may be communicatively coupled as shown in FIG. 6, and include controllers that implement the logic block shown in FIG. 6. Computing device 810 may also be coupled or connected to storage 836, which may comprise local or remote storage, e.g., on a Storage Area Network (SAN), that stores data accumulated as part of a customer's operation. Computing device 810 may comprise a stand-alone computer (e.g., desktop or laptop) or a server associated with a customer. A given customer may also implement as part of its business multiple computing devices as servers. Memory 816 stores information accessible by the one or more processors 812, including instructions 832 and data 834 that may be executed or otherwise used by the processor(s) 812. The memory 816 may be of any type capable of storing information accessible by the processor, including a computing device-readable medium, or other medium that stores data that may be read with the aid of an electronic device, such as a hard drive, memory card, ROM, RAM, DVD, or other optical disks, as well as other write-capable and read-only memories. Systems and methods may include different combinations of the foregoing, whereby different portions of the instructions and data are stored on different types of media.

The instructions 832 may be any set of instructions to be executed directly (such as machine code) or indirectly (such as scripts) by the processor 812. For example, the instructions may be stored as computing device code on the computing device-readable medium. In that regard, the terms "instructions" and "programs" may be used interchangeably herein. The instructions may be stored in object code format for direct processing by the processor, or in any other computing device language, including scripts or collections of independent source code modules that are interpreted on demand or compiled in advance. Processes, functions, methods, and routines of the instructions are explained in more detail below.

The data 834 may be retrieved, stored, or modified by processor 812 in accordance with the instructions 832. As an example, data 834 associated with memory 816 may comprise data used in supporting services for one or more client devices, an application, etc. Such data may include data to support hosting web-based applications, file share services, communication services, gaming, sharing video or audio files, or any other network-based services.

The one or more processors 812 may be any conventional processor, such as commercially available CPUs. Alternatively, the one or more processors may be a dedicated device such as an ASIC or other hardware-based processor. Although FIG. 6 functionally illustrates the processor, memory, and other elements of computing device 810 as being within the same block, it will be understood by those of ordinary skill in the art that the processor, computing device, or memory may actually include multiple processors, computing devices, or memories that may or may not be located or stored within the same physical housing. In one example, one or more computing devices 810 may include one or more server computing devices having a plurality of computing devices (e.g., a load-balanced server farm) that exchange information with different nodes of a network for the purpose of receiving, processing, and transmitting the data to and from other computing devices as part of customer's business operation.

Computing device 810 may also include a display 820 (e.g., a monitor having a screen, a touch-screen, a projector, a television, or other device that is operable to display information) that provides a user interface that allows for controlling the computing device 810. Such control may include, for example, using a computing device to cause data to be uploaded through input system 828 to cloud system 850 for processing, cause accumulation of data on storage 836, or more generally, manage different aspects of a customer's computing system. While input system 828 may be used to upload data, e.g., a USB port, computing system 800 may also include a mouse, keyboard, touchscreen, or microphone that can be used to receive commands and/or data.

The network 840 may include various configurations and protocols including short range communication protocols such as Bluetooth™, Bluetooth™ LE, the Internet, World Wide Web, intranets, virtual private networks, wide area networks, local networks, private networks using communication protocols proprietary to one or more companies, Ethernet, WiFi, HTTP, etc., and various combinations of the foregoing. Such communication may be facilitated by any device capable of transmitting data to and from other computing devices, such as modems and wireless interfaces. Computing device 810 interfaces with network 840 through communication interface 824, which may include the hardware, drivers, and software necessary to support a given communications protocol.

Cloud computing systems 850 may comprise one or more data centers that may be linked via high speed communications or computing networks. A given data center within system 850 may comprise dedicated space within a building that houses computing systems and their associated components, e.g., storage systems and communication systems. Typically, a data center will include racks of communication equipment, servers/hosts, and disks. The servers/hosts and disks comprise physical computing resources that are used to provide virtual computing resources such as VMs. To the extent that a given cloud computing system includes more than one data center, those data centers may be at different geographic locations within relative close proximity to each other, chosen to deliver services in a timely and economically efficient manner, as well as provide redundancy and maintain high availability. Similarly, different cloud computing systems are typically provided at different geographic locations.

As shown in FIG. 8, computing system 850 may be illustrated as comprising infrastructure 852, storage 854 and computer system 858. Infrastructure 852, storage 854 and computer system 858 may comprise a data center within a cloud computing system 850. Infrastructure 852 may comprise servers, switches, physical links (e.g., fiber), and other equipment used to interconnect servers within a data center with storage 854 and computer system 858. Storage 854 may comprise a disk or other storage device that is partitionable to provide physical or virtual storage to virtual machines running on processing devices within a data center. Storage 854 may be provided as a SAN within the datacenter hosting the virtual machines supported by storage 854 or in a different data center that does not share a physical location with the virtual machines it supports. Computer system 858 acts as supervisor or managing agent for jobs being processed by a given data center. In general, computer system 858 will contain the instructions necessary to, for example, manage the operations requested as part of a synchronous training operation on customer data. Computer system 858 may receive jobs, for example, as a result of input received via an application programming interface (API) from a customer.

Aspects of the disclosed technology may be embodied in a method, process, apparatus, or system. Those examples may include one or more of the following features (e.g., F1 through F19):

F1. A method for encoding data associated with a request access for one or more DRAM devices, comprising:
  segmenting a number of beats defined for a burst access to the one or more DRAMs in at least a first set of beats and a second set of beats;
  defining a first error correction code (ECC) for a first set of the data associated with the first set of beats; and
  defining a second ECC for a second set of the data associated with the second set of beats;
  wherein the first ECC comprises a first set of symbols, each symbol of the first set being associated with the first set of beats, and
  wherein the second ECC comprises a second set of symbols, each symbol of the second set of symbols being associated with the second set of beats.

F2. The method of F1, wherein the first set of beats and the second set of beats equal the number of beats defined for the burst access.

F3. The method of any one F1 and F2, wherein the one or more DRAMs comprise DDR5 DRAMs and the number of beats defined for the burst access comprises 16 beats.

F4. The method of F3, wherein the first set of beats and second set of beats each comprise 8 beats.

F5. The method of F4, wherein the one or more DRAMs each include 4 data pins.

F6. The method of F5, wherein the one or more DRAMs comprise 10 DRAMs and the first error correction code comprises a Reed Solomon with code 8 ECCs for 32 data symbols and 8 bits/symbol such as RS(40, 32, 8).

F7. The method of F6, wherein the second error correction code comprises a Reed Solomon code with 8 ECCs for 32 data symbols and 8 bits/symbol such as RS(40, 32, 8).

F8. The method of F7, comprising defining a second 4 byte symbol associated with the second error ECC, the second 4 byte symbol comprising metadata associated with a memory tag extension or another ECC scheme.

F9. A memory system, comprising:
  one or more DRAMs; and
  a memory controller communicatively coupled to the one or more DRAMs, the memory controller having logic that implements the following function in response to a request access to the one or more DRAMs:
    segment a number of beats defined for a burst access to the one or more DRAMs in at least a first set of beats and a second set of beats;
    define a first error correction code (ECC) for a first set of the data associated with the first set of beats;
    define a second ECC for a second set of the data associated with the second set of beats;
    wherein the first ECC comprises a first set of symbols, each symbol of the first set being associated with the first set of beats, and
    wherein the second ECC comprises a second set of symbols, each symbol of the second set of symbols being associated with the second set of beats.

F10. The memory system of F9, wherein the first set of beats and the second set of beats equal the number of beats defined for the burst access.

F11. The memory system of any one of F9 and F10, wherein the one or more DRAMs comprises DDR5 DRAMs and the number of beats defined for the burst access comprises 16 beats.

F12. The memory system of F11, wherein the first set of beats and the second set of beats each comprise 8 beats.

F13. The memory system of F12, wherein the one or more DRAMs each include 4 data pins.

F14. The memory system of F13, wherein the one or more DRAMs comprise 10 DRAMs and the first error correction code comprises a Reed Solomon code with 8 ECCs for 32 data symbols and 8 bits/symbol such as RS(40, 32, 8).

F15. The memory system of F13, wherein the second error correction code comprises a Reed Solomon code with 8 ECCs for 32 data symbols and 8 bits/symbol such as RS(40, 32, 8).

F16. The memory system of F15, wherein the logic functions to define a second 4 byte symbol associated with the second error ECC, the second 4 byte symbol comprising metadata associated with a memory tag extension or another ECC scheme.

F17. The memory system of any one of F9 through F16, wherein the logic comprises hardware logic comprising an encoder and a decoder.

F18. The memory system of F17, wherein the encoder encodes the first set of data using the first ECC in a first cycle of a 64 byte transaction and the encoder encodes the second set of data using the second ECC in a second cycle of the 64 byte transaction.

F19. The memory system of F17, wherein the decoder decodes the first set of data using the first ECC in a first cycle of the 64 byte transaction and the decoder decodes the second set of data using the second ECC in a second cycle of the 64 byte transaction.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for encoding data associated with a request access for one or more DRAMs, comprising:
segmenting a number of beats defined for a burst access to the one or more DRAMs into at least a first set of beats and a second set of beats;
defining a first set of error correction code (ECC) for a first set of data associated with the first set of beats; and
defining a second set of ECC for a second set of data associated with the second set of beats;
wherein one of the first set of ECC comprises a first set of symbols, each symbol of the first set being associated with the first set of beats,
wherein one of the second set of ECC comprises a second set of symbols, each symbol of the second set of symbols being associated with the second set of beats, wherein the first set of symbols comprises a different number of symbols than the second set of symbols and an error associated with the second set of ECC is correctable using information of the first set of ECC, and wherein the second set of ECC comprises one or more symbols used for storing metadata, the metadata being associated with a memory tag extension.

2. The method of claim 1, wherein the first set of beats and the second set of beats equal the number of beats defined for the burst access.

3. The method of claim 1, wherein the one or more DRAMs comprise DDR5 DRAMs and the number of beats defined for the burst access comprises 16 beats.

4. The method of claim 3, wherein the first set of beats and second set of beats each comprise 8 beats.

5. The method of claim 4, wherein the one or more DRAMs each include 4 data pins.

6. The method of claim 5, wherein the one or more DRAMs comprise 10 DRAMs and the first set of error correction code comprises a Reed Solomon with code 8 ECCs for 32 data symbols and 8 bits/symbol such as RS (40, 32, 8).

7. The method of claim 6, wherein the second set of error correction code comprises a Reed Solomon code with 8 ECCs for 32 data symbols and 8 bits/symbol such as RS(40, 32, 8).

8. The method of claim 7, comprising defining a second 4 byte symbol associated with the second set of ECC, the second 4 byte symbol comprising the metadata.

9. The method of claim 1, wherein the number of the second set of symbols is half the number of the first set of symbols.

10. A memory system, comprising:
one or more DRAMs; and
a memory controller communicatively coupled to the one or more DRAMs, the memory controller having logic that implements the following function in response to a request access to the one or more DRAMs:
segment a number of beats defined for a burst access to the one or more DRAMs in at least a first set of beats and a second set of beats;
define a first set of error correction code (ECC) for a first set of data associated with the first set of beats;
define a second set of ECC for a second set of data associated with the second set of beats;
wherein one of the first set of ECC comprises a first set of symbols, each symbol of the first set being associated with the first set of beats,
wherein one of the second set of ECC comprises a second set of symbols, each symbol of the second set of symbols being associated with the second set of beats, wherein the first set of symbols comprises a different number of symbols than the second set of symbols and an error associated with the second set of ECC is correctable using information of the first set of ECC, and wherein the second set of ECC comprises one or more symbols used for storing metadata, the metadata being associated with a memory tag extension.

11. The memory system of claim 10, wherein the first set of beats and the second set of beats equal the number of beats defined for the burst access.

12. The memory system of claim 10, wherein the one or more DRAMs comprises DDR5 DRAMs and the number of beats defined for the burst access comprises 16 beats.

13. The memory system of claim 12, wherein the first set of beats and the second set of beats each comprise 8 beats.

14. The memory system of claim 13, wherein the one or more DRAMs each include 4 data pins.

15. The memory system of claim 14, wherein the one or more DRAMs comprise 10 DRAMs and the first set of error correction code comprises a Reed Solomon code with 8 ECCs for 32 data symbols and 8 bits/symbol such as RS (40, 32, 8).

16. The memory system of claim 14, wherein the second set of error correction code comprises a Reed Solomon code with 8 ECCs for 32 data symbols and 8 bits/symbol such as RS (40, 32, 8).

17. The memory system of claim 16, wherein the logic functions to define a second 4 byte symbol associated with the second set of ECC, the second 4 byte symbol comprising the metadata.

18. The memory system of claim 10, wherein the logic comprises hardware logic comprising an encoder and a decoder.

19. The memory system of claim 18, wherein the encoder encodes the first set of data using the first set of ECC in a first cycle of a 64 byte transaction and the encoder encodes the second set of data using the second set of ECC in a second cycle of the 64 byte transaction.

20. The memory system of claim 18, wherein the decoder decodes the first set of data using the first set of ECC in a first cycle of a 64 byte transaction and the decoder decodes the second set of data using the second set of ECC in a second cycle of the 64 byte transaction.

* * * * *